(12) United States Patent
Xu et al.

(10) Patent No.: US 8,073,052 B1
(45) Date of Patent: Dec. 6, 2011

(54) LAYERED WYNER-ZIV VIDEO CODING FOR TRANSMISSION OVER UNRELIABLE CHANNELS

(75) Inventors: Qian Xu, College Station, TX (US); Vladimir M. Stankovic, Lancaster (GB); Zixiang Xiong, Spring, TX (US)

(73) Assignee: The Texas A&M University System, College Station, TX (US)

( * ) Notice: Subject to any disclaimer, the term of this patent is extended or adjusted under 35 U.S.C. 154(b) by 1531 days.

(21) Appl. No.: 11/494,678

(22) Filed: Jul. 27, 2006

(51) Int. Cl.
*H04N 7/12* (2006.01)
(52) U.S. Cl. .................................. 375/240.03
(58) Field of Classification Search ............. 375/240.03
See application file for complete search history.

(56) References Cited

U.S. PATENT DOCUMENTS
5,499,254 A 3/1996 Ikekawa et al.
7,746,758 B2 6/2010 Stolpman

OTHER PUBLICATIONS

S. Pradhan, J. Kusuma, and K. Ramchandran, "Distributed compression in a dense microsensor network," IEEE Signal Processing Magazine, vol. 19, pp. 51-60, Mar. 2002.
Z. Xiong, A. Liveris, and S. Cheng, "Distributed source coding for sensor networks," IEEE Signal Processing Magazine, vol. 21, pp. 80-94, Sep. 2004.
D. Slepian and J.K. Wolf, "Noiseless coding of correlated information sources," IEEE Trans. Inform. Theory, vol. 19, pp. 471-480, Jul. 1973.
A. Wyner and J. Ziv, "The rate-distortion function for source coding with side information at the decoder," IEEE Trans. Inform. Theory, vol. 22, pp. 1-10, Jan. 1976.
B. Girod, A. Aaron, S. Rane, and D. Rebollo-Monedero, "Distributed video coding," Proc. of the IEEE, vol. 93, pp. 71-83, Jan. 2005.
A. Sehgal, A. Jagmohan, and N. Ahuja, "Wyner-Ziv Coding of Video: An Error-Resilient Compression Framework," IEEE Trans. Multimedia, vol. 6, pp. 249-258, Apr. 2004.
R. Puri and K. Ramchandran, "PRISM: A New Robust video coding architecture based on distributed compression principles," submitted to IEEE Trans. Image Processing, 2003.
Y. Sterinberg and N. Merhav, "On successive refinement for the Wyner-Ziv problem,"IEEE Trans. Inform. Theory, vol. 50, pp. 1636-1654, Aug. 2004.
Q. Xu and Z. Xiong, "Layered Wyner-Ziv video coding," submitted to IEEE Trans. Image Processing, Jul. 2004.
W. Li, "Overview of fine granularity scalability in MPEG-4 video standard", IEEE Trans. Circuits and Systems for Video Tech., vol. 11, pp. 301-317, Mar. 2001.
A. Wyner, "Recent results in the Shannon theory," IEEE Trans. Inform. Theory, vol. 20, pp. 2-10, Jan. 1974.
S. Shamai, S. Verdu, and R. Zamir, "Systematic lossy source/channel coding," IEEE Trans. Inform. Theory, vol. 44, pp. 564-579, Mar. 1998.

(Continued)

*Primary Examiner* — Jay Patel
*Assistant Examiner* — Richard Torrente
(74) *Attorney, Agent, or Firm* — Knobbe, Martens, Olson & Bear LLP

(57) ABSTRACT

A system and method for video coding. Energy-concentrating transform operations are performed on video data to obtain transformed data. Nested scalar quantization is performed on the transformed data to generate blocks of coset indices. Bit planes of the blocks of coset indices are encoded using irregular repeat accumulate (IRA) encoders to generate corresponding bit streams. The bit streams are transmitted to a destination device over a channel. A decoder of the destination device receives input data, corresponding to transmitted bit streams, from the channel. The input data is decoded, using side information, to obtain estimates for the blocks of coset indices. Output video data (i.e., an estimate of the original video data) is generated using the estimated blocks of coset indices and the side information.

27 Claims, 8 Drawing Sheets

Block diagram of the proposed layered Wyner-Ziv video codec.

OTHER PUBLICATIONS

H. Jin, A. Khandekar, and R. McEliece, "Irregular repeat-accumulate codes," in Proc. 2nd Int. Symp. on Turbo codes, Brest, France, Sep. 2000.

A. D. Liveris, Z. Xiong, and C. Georghiades, "Joint source-channel coding of binary sources with side information at the decoder using IRA codes," in Proc. Multimedia Signal Processing Workshop, St. Thomas, US Virgin Islands, Dec. 2002.

V. Stankovic, A. Liveris, Z. Xiong, and C. Georghiades, "Design of Slepian-Wolf codes by channel code partitioning," in Proc. DCC-2004 Data Compression Conference, Snowbird, UT, Mar. 2004.

R. Zamir, S. Shamai, and U. Erez, "Nested linear/lattice codes for structured multiterminal binning," IEEE Trans. Inform. Theory, vol. 48, pp. 1250-1276, Jun. 2002.

G.D. Forney Jr., "Coset codes-I: Introduction and geometrical classification," IEEE Trans. Inform. Theory, vol. 34, pp. 1123-1151, Sep. 1988.

G.D. Forney Jr., "Coset codes-II: Binary lattices and related codes," IEEE Trans. Inform. Theory, vol. 34, pp. 1152-1187, Sep. 1988.

C. E. Shannon, "A mathematical theory of communication," Bell Syst. Tech. J., vol. 27, pt. I, pp. 379-423, 1948; pt. II, pp. 623-656, 1948.

S. Cheng and Z. Xiong, "Successive refinement for the Wyner-Ziv problem and layered code design," in Proc. DCC-2004 Data Compression Conference, Snowbird, UT, Apr. 2004.

M. Gastpar, P. Dragotti, and M. Vetterli, "The distributed Karhunen-Loµeve transform," submitted to IEEE Trans. Inform. Theory, Nov. 2004.

A. Aaron and B. Girod, "Compression with side information using turbo codes," in Proc. DCC-2002 Data Compression Conference, Snowbird, UT, Apr. 2002.

J. Garcia-Frias, "Joint source-channel decoding of correlated sources over noisy channels," in Proc. DCC-2001 Data Compression Conference, Snowbird, UT, Mar. 2001.

P. Mitran and J. Bajcsy, "Turbo source coding: A noise-robust approach to data compression," in Proc. DCC-2002 Data Compression Conference, Snowbird, UT, Apr. 2002.

Z. Xiong, A. Liveris, S. Cheng, and Z. Liu, "Nested quantization and Slepian-Wolf coding: A Wyner-Ziv coding paradigm for i.i.d. sources," in Proc. IEEE Workshop on Statistical Signal Processing, St. Louis, MO, Sep. 2003.

S.-Y. Chung, On the Construction of Some Capacity-Approaching Coding Schemes, Ph.D. dissertation, Massachusetts Institute of Technology, 2000.

Q. Xu, V. Stankovic, A.D. Liveris, and Z. Xiong, "Distributed joint source-channel coding of video," to appear in Proc. ICIP-2005 IEEE International Conference on Image Processing, Genova, Italy, Sep. 2005.

V. Stankovic, A. Liveris, Z. Xiong, and C. Georghiades, "On code design for the Slepian-Wolf Problem and Lossless Multiterminal networks" IEEE transactions on information theory, vol. 52, No. 4, Apr. 2006 pp. 1495-1570.

A Shokroliahi, "Raptor codes," IEEE Trans. Inform. Theory, vol. 52, pp. 2551-2567, Jun. 2006.

N. Rahnavard and F. Fekri, "Finite-Length Unequal Error Protection Rateless Codes: Design and Analysis," Proc. IEEE Globecom-2005; Saint Louis, MO; Nov. 2005.

Xu, Qian, et al., "Distributed Joint Source-Channel Coding of Video Using Raptor Codes," IEEE Proceedings of the 2005 Data Compression Conference; Published Mar. 14, 2005, 1 pg.

Xu, Qian, et al., "Distributed Joint Source-Channel Coding of Video," IEEE Proceedings of International Conference on Image Processing (ICIP'05); Published Sep. 11, 2005; 4 pgs.

Xu, Qian, et al., "Layered Wyner-Ziv Video Coding," Proceedings VCIP'04: Special Session on Multimedia Technologies for Embedded Systems; Published Jan. 2004; 9 pgs.

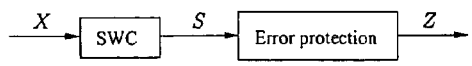
Figure 2: A distributed separate source-channel code design.
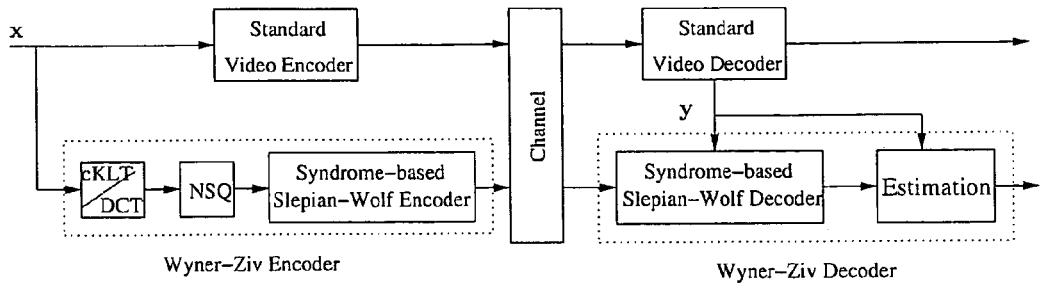
Figure 3: Block diagram of the layered Wyner-Ziv video codec of [9].
PRIOR ART
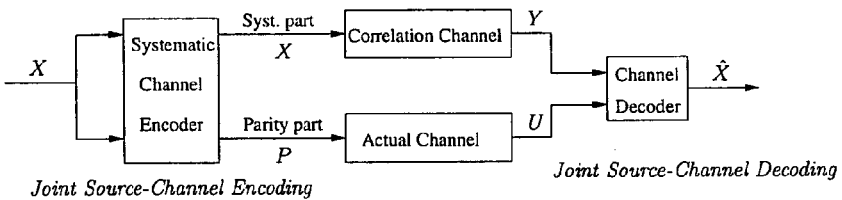
Figure 4: The two equivalent channels for JSCC of $X$ with side information $Y$ at the decoder.
PRIOR ART

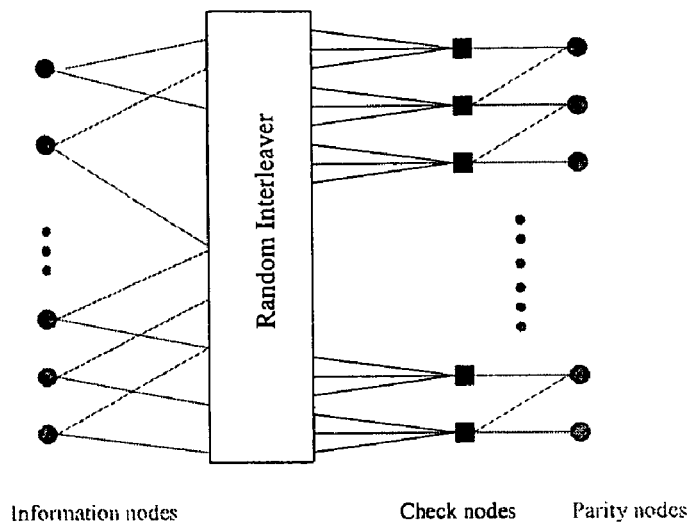
Figure 5: Graph representation for IRA codes.
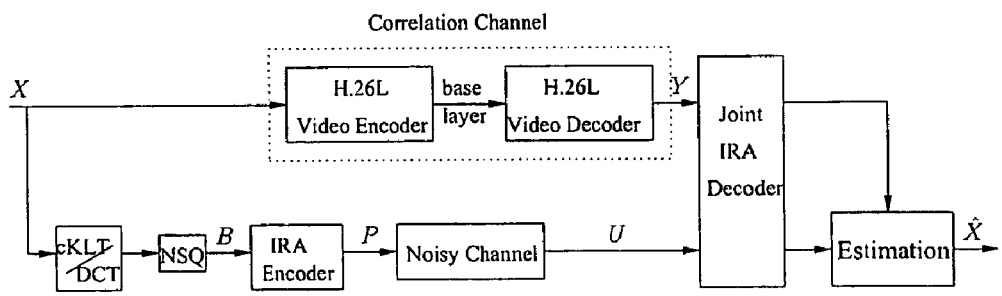
Figure 6: Block diagram of the proposed layered Wyner-Ziv video codec.

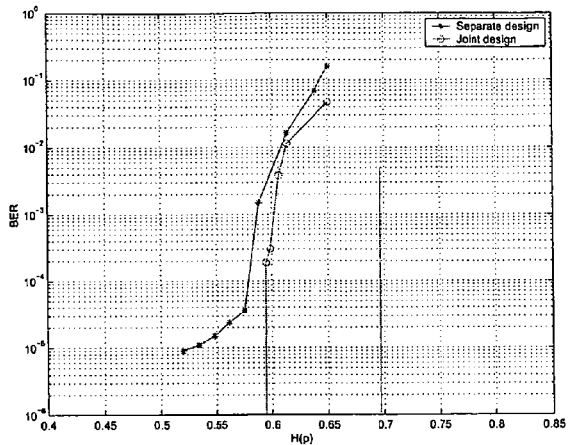

Figure 7: Comparison between a separate design (syndrome-based SWC with an LDPC code plus error protection with an IRA code) and the joint design (parity-based SWC with an IRA code) for uniform memoryless sources. The correlation between the source and side information is modeled as a BSC with crossover probability $p$. Residual bit error rate (BER) in terms of conditional entropy $H(p)$ (in bits) is presented. Transmission channel is an AWGN channel with SNR -5.02 dB.

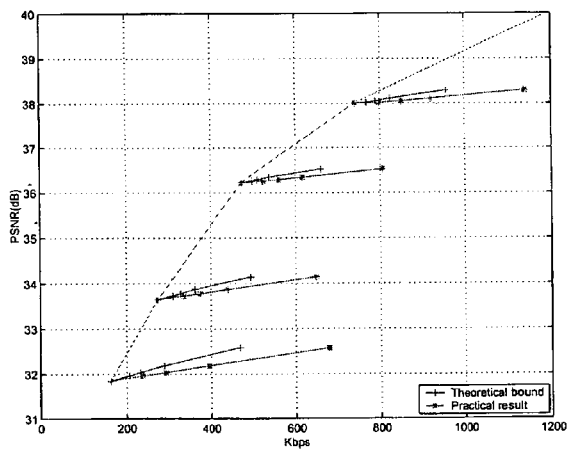

Figure 8: Performance of the proposed Wyner-Ziv video coder for the "Foreman" sequence over the BSC with crossover probability 0.05 together with the theoretical limit.

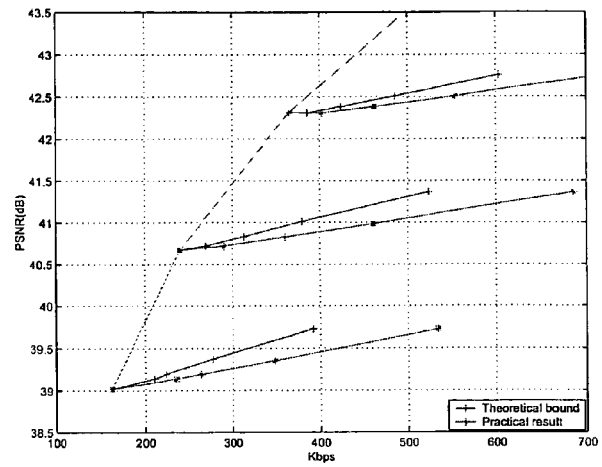
Figure 9: Performance of the proposed Wyner-Ziv video coder for the "Mother & daughter" sequence over the BSC with crossover probability 0.05 together with the theoretical limit.
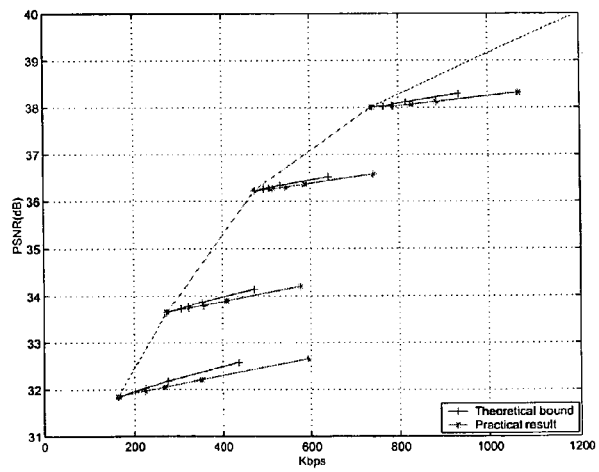
Figure 10: Performance of the proposed Wyner-Ziv video coder for the "Foreman" sequence over the AWGN channel with SNR 1 dB together with the theoretical limit.

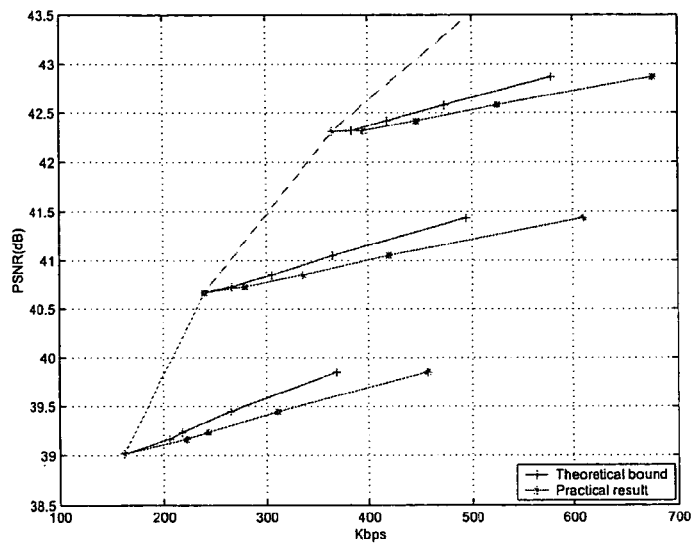
Figure 11: Performance of the proposed Wyner-Ziv video coder for the "Mother & daughter" sequence over the AWGN channel with SNR 1 dB together with the theoretical limit.

Figure 12: The theoretical rate limits and the transmission rates used for each of four bitplanes after NSQ of the DC component (a), the first AC component (b), and the second AC component (c) of the DCT coefficients. The transmission channel is the AWGN channel with SNR=1dB.

| $i$th bitplane | $H(B_i|Y, B_{i-1},\ldots,B_0)/C$ | Transmission rate |
|---|---|---|
| 0 | 0.046 | 0.091 |
| 1 | 0.036 | 0.079 |
| 2 | 0.109 | 0.169 |
| 3 | 0.205 | 0.308 |

(a)

| $i$th bitplane | $H(B_i|Y, B_{i-1},\ldots,B_0)/C$ | Transmission rate |
|---|---|---|
| 0 | 0.064 | 0.111 |
| 1 | 0.001 | 0.020 |
| 2 | 0.011 | 0.040 |
| 3 | 0.077 | 0.130 |

(b)

| $i$th bitplane | $H(B_i|Y, B_{i-1},\ldots,B_0)/C$ | Transmission rate |
|---|---|---|
| 0 | 0.002 | 0.020 |
| 1 | 0.042 | 0.079 |
| 2 | 0.023 | 0.060 |
| 3 | 0.140 | 0.200 |

(c)

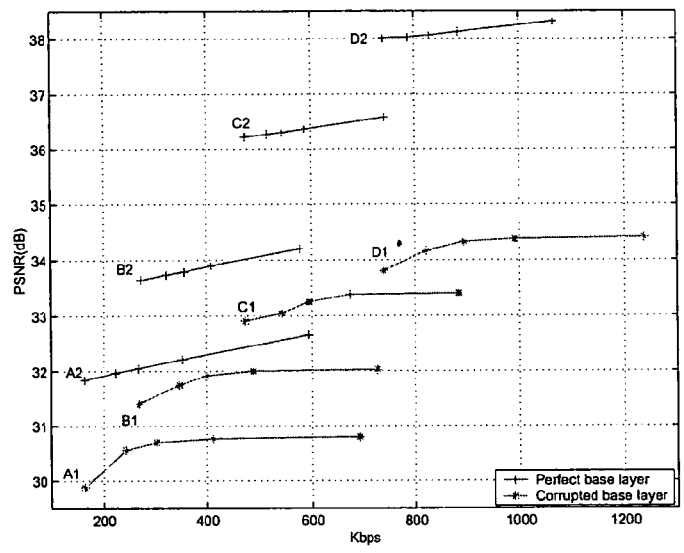

Figure 13: Performance of the proposed Wyner-Ziv video coder with the perfect base layer (decoder side information) and with a base layer transmitted over the erasure channel with crossover probability 0.01. In both cases the enhancement layers are transmitted over the AWGN channel with SNR 1 dB. The "Foreman" video sequence is used. Points denoted by the same letter (e.g., $A_1$ and $A_2$) correspond to the same bit rate of the base layer.

LAYERED WYNER-ZIV VIDEO CODING FOR TRANSMISSION OVER UNRELIABLE CHANNELS

The U.S. Government has a paid-up license in this invention and the right in limited circumstances to require the patent owner to license others on reasonable terms as provided for by the terms of grant number CCR-01-04834 awarded by the National Science Foundation (NSF) and grant number CCF-04-30720 also awarded by the NSF.

FIELD OF THE INVENTION

The present invention relates generally to the field of video transmission, and more specifically, to the field of scalable video coding.

DESCRIPTION OF THE RELATED ART

Scalable video coding has attracted increased interest recently due to emerging applications such as interactive video, wireless video surveillance networks, video broadcast/multicast, PC cameras, and camera phones. Because the transmission links are often severely corrupted, video compression must be robust to channel noise and packet loss. However, though offering high rate-distortion performance in the noiseless environment, standard video coders (e.g., MPEG and H.264) are very sensitive to packet loss and channel errors, because of error propagation/drifting problems.

SUMMARY

Wyner-Ziv coding refers to lossy source coding with decoder side information. This specification considers the case where the channel is noisy and addresses distributed joint source-channel coding, while targeting at the important application of scalable video transmission over networks (e.g., wireless networks). In Wyner-Ziv coding, after quantization, Slepian-Wolf coding (SWC) is used to reduce the rate. SWC is traditionally realized by sending syndromes of a linear channel code. Since syndromes of the channel code can only compress but cannot protect, for transmission over noisy channels, additional error protection is needed. However, instead of using one channel code for SWC and one for error protection, our idea is to use a single channel code to achieve both compression and protection. We replace the traditional syndrome-based SWC scheme by a parity-based one, where only parity bits of the Slepian-Wolf channel code are sent. If the amount of transmitted parity bits increases above the Slepian-Wolf limit, the added redundancy is exploited to cope against the noise in the transmission channel. Using IRA codes for practical parity-based SWC, we design a novel layered Wyner-Ziv video coder which is robust to channel failures and thus very suitable for wireless communications. Our simulation results compare the proposed solution based on joint source-channel coding to the traditional approach where source and channel coding are performed separately.

BRIEF DESCRIPTION OF THE DRAWINGS

The following detailed description makes reference to the accompanying drawings, which are now briefly described.

FIG. 2 illustrates a distributed separate source-channel code design.

FIG. 3 is a block diagram of the layered Wyner-Ziv video codec of reference [9].

FIG. 4 illustrates the two equivalent channels for joint source-channel coding (JSCC) of X with side information Y at the decoder.

FIG. 5 illustrates one embodiment of a graph representation for IRA codes.

FIG. 6 is a block diagram of one embodiment of the proposed layered Wyner-Ziv video codec.

FIG. 7 is a comparison between a separate design (syndrome-based SWC with an LDPC code plus error protection with an IRA code) and the joint design (parity-based SWC with an IRA code) for uniform memoryless sources. The correlation between the source and side information is modeled as a BSC with crossover probability p. Residual bit error rate (BER) in terms of conditional entropy H(p) (in bits) is presented. Transmission channel is an AWGN channel with SNR -5.02 dB.

FIG. 8 illustrates the performance of the proposed Wyner-Ziv video coder for the "Foreman" sequence over the BSC with crossover probability 0.05 together with the theoretical limit.

FIG. 9 illustrates performance of the proposed Wyner-Ziv video coder for the "Mother & daughter" sequence over the BSC with crossover probability 0.05 together with the theoretical limit.

FIG. 10 illustrates performance of the proposed Wyner-Ziv video coder for the "Foreman" sequence over the AWGN channel with SNR 1 dB together with the theoretical limit.

FIG. 11 illustrates performance of the proposed Wyner-Ziv video coder for the "Mother & daughter" sequence over the AWGN channel with SNR 1 dB together with the theoretical limit.

FIG. 12 is a table presenting the theoretical rate limits and the transmission rates used for each of four bitplanes after NSQ of the DC component (a), the first AC component (b), and the second AC component (c) of the DCT coefficients. The transmission channel is the AWGN channel with SNR=1 dB.

FIG. 13 illustrates performance of the proposed Wyner-Ziv video coder with the perfect base layer (decoder side information) and with the base layer transmitted over the erasure channel with crossover probability 0.01. In both cases the enhancement layers are transmitted over the AWGN channel with SNR 1 dB. The "Foreman" video sequence is used. Points denoted by the same letter (e.g., $A_1$ and $A_2$) correspond to the same bit rate of the base layer.

While the invention is described herein by way of example for several embodiments and illustrative drawings, those skilled in the art will recognize that the invention is not limited to the embodiments or drawings described. It should be understood, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this specification, the word "may" is used in a permissive sense (i.e., in the sense of "having the potential to"), rather than in the mandatory sense (i.e., in the sense of "must"). Furthermore, the phrase "A includes B" is used to mean "A includes B, but is not limited to B".

DETAILED DESCRIPTION

Please note that a list of references is included at the end of this detailed description. The notation "[n]" is to be interpreted as a reference to the $n^{th}$ reference in the list of references.

Figure 1A:
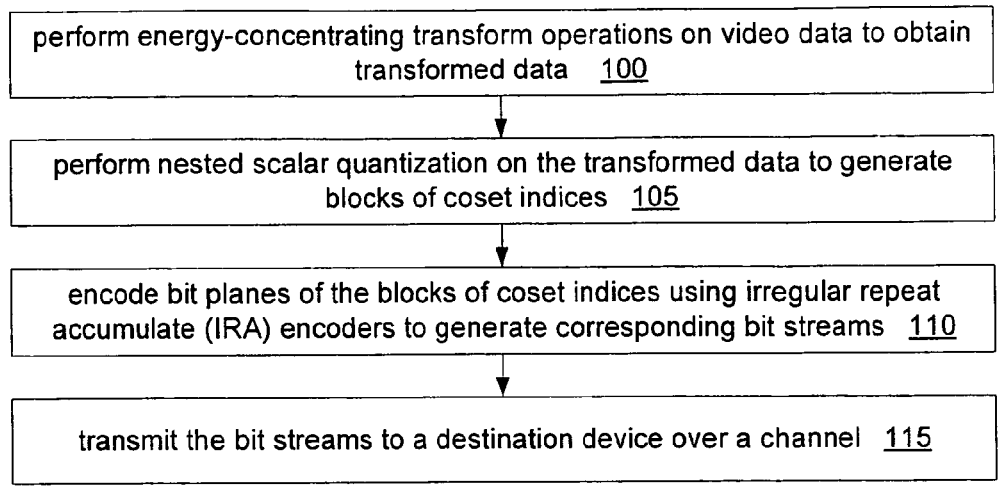
FIG. 1A illustrates one set of embodiments of a method for encoding video data.

In one set of embodiments, a method for encoding video data to achieve both source coding and error protection may involve the following actions, as illustrated in FIG. 1A.

At 100, energy-concentrating transform operations may be performed on video data to obtain transformed data. The video data may include $N_F$ video frames, where $N_F$ is a positive integer. The energy-concentrating transform operations serve to concentrate the energy of each block (of each frame) in a few of the transform coefficients $C(I,J)$, where I and J are integers in the range from zero to $N_L-1$, where $N_L$ is the side length of the block in terms of pixels. (Various values of $N_L$ are contemplated. In one embodiment, $N_L=4$. In another embodiment, $N_L=8$.)

In one embodiment, the energy-concentrating transform operations are discrete cosine transform (DCT) operations. Each block of each of the $N_F$ frames may be transformed using the DCT. In another embodiment, the energy-concentrating transform operations are Karhunen-Loève transform operations. Each block of each of the $N_F$ frames may be transformed using the KLT.

At 105, nested scalar quantization (NSQ) may be performed on the transformed data to generate $N_S$ blocks of coset indices, where $N_S$ is a positive integer. Each of the $N_S$ blocks is generated based on a corresponding one of the transform coefficients. For example, in one embodiment, $N_S=3$ and the three blocks of coset indices are generated based respectively on the three coefficients $C(0,0)$, $C(0,1)$ and $C(1,0)$ as follows. A first block $V_{00}$ of coset indices may be generated by performing NSQ on the $C(0,0)$ coefficient from each block of each of the $N_F$ frames, and concatenating the coset indices generated from each NSQ performance. A second block $V_{10}$ of coset indices may be similarly generated based on the $C(0,1)$ coefficients. A third block $V_{10}$ of coset indices may be similarly generated based on the $C(1,0)$ coefficients. Each of the coset indices is $N_C$ bits long and each block includes $N_F*N_B$ coset indices, where $N_g$ is the number of blocks per frame. More generally, NSQ may be performed based on a group of $N_S$ coefficients near the transformed block origin to $N_S$ blocks of coset indices. For example, in the $N_S=4$ case, the coefficients $C(0,0)$, $C(0,1)$, $C(1,0)$ and $C(1,1)$ may be used.

At 110, the bit planes of the blocks of coset indices may be encoded using irregular repeat accumulate (IRA) encoders to generate corresponding bit streams. Each block of coset indices has $N_C$ bit planes since each coset index is $N_C$ bits long. The $k^{th}$ bit plane of a given block of coset indices is the ensemble of bits including the $k^{th}$ bit of each coset index of that block. Index k ranges from 0 to $N_C-1$.

Each bit plane of each block of coset indices may be encoded using a corresponding IRA encoder. Thus, $N_C*N_S$ IRA encoders are used to encode the blocks of coset indices and $N_C*N_S$ bits streams are generated. For example, in the case $N_S=3$ and $N_C=4$, 12 IRA encoders are used. Each of the IRA encoders may be separately designed according to the procedure described below (especially in the section 3.2.3). The design procedure guarantees that each IRA encoder performs both source coding and error protection coding on the corresponding bit plane.

At 115, the bit streams generated by the IRA encoders may be transmitted to a destination device over a channel. The channel may be noisy.

The method may further involve encoding a version of the video data to obtain encoded data $D_V$, where the version V has a lower image quality than the video data itself. The encoding may be performed using a standard video encoder such as MPEG or H.264. The encoded data $D_V$ may be transmitted to the destination device over the channel.

In some embodiments, a computer-readable memory medium may be configured to store program instructions, where the program instructions are executable to implement any of the method embodiments described herein (or any combination of the method embodiments described herein).

A memory medium is a medium configured for the storage of information. Examples of memory media include various kinds of magnetic media (e.g., magnetic tape, magnetic disk, magnetic strips, and magnetic film); various kinds of optical media (e.g., CD-ROM); various kinds of semiconductor RAM and ROM; various media based on the storage of electrical charge and/or other physical quantities; etc.

In some embodiments, a computer system may be configured to include a processor and memory medium. The memory medium may be configured to store program instructions. The processor may be configured to read and execute the program instructions. The program instructions may be executable to implement any of the various method embodiments described herein. The computer system may be realized in any of various forms. For example, the computer system may be a personal computer (in any of its various forms), a computer on a card, a server computer, a client computer, a computer system embedded in a sensor device, etc.

In some embodiments, a video encoding system may be configured to include a transform unit, a quantization unit, an encoding unit $E_{enh}$ and a transmitter. The transform unit may be configured to perform energy-concentrating transform operations on video data to obtain transformed data. The quantization unit may be configured to perform nested scalar quantization on the transformed data to determine blocks of coset indices. The encoding unit $E_{enh}$ may be configured to encode bit planes of the blocks of coset indices using corresponding irregular repeat accumulate (IRA) encoders to generate corresponding bit streams. The transmitter may be configured to transmit the bit streams over a channel.

The video encoding system may be realized in any of various forms. For example, in one embodiment, the video encoding system is realized as an application specific integrated circuit (ASIC). In another embodiment, the transform unit, the quantization unit and the encoding unit $E_{enh}$ is realized in a dedicated ASIC and the transmitter is realized in separate circuitry.

The video encoding system may also include an encoding unit $E_{base}$ configured to encode a version of the video data to obtain encoded data $D_V$, where the version has a lower image quality than the video data. The transmitter may also be configured to transmit the encoded data $D_V$ to the destination device over the channel.

Figure 1B:
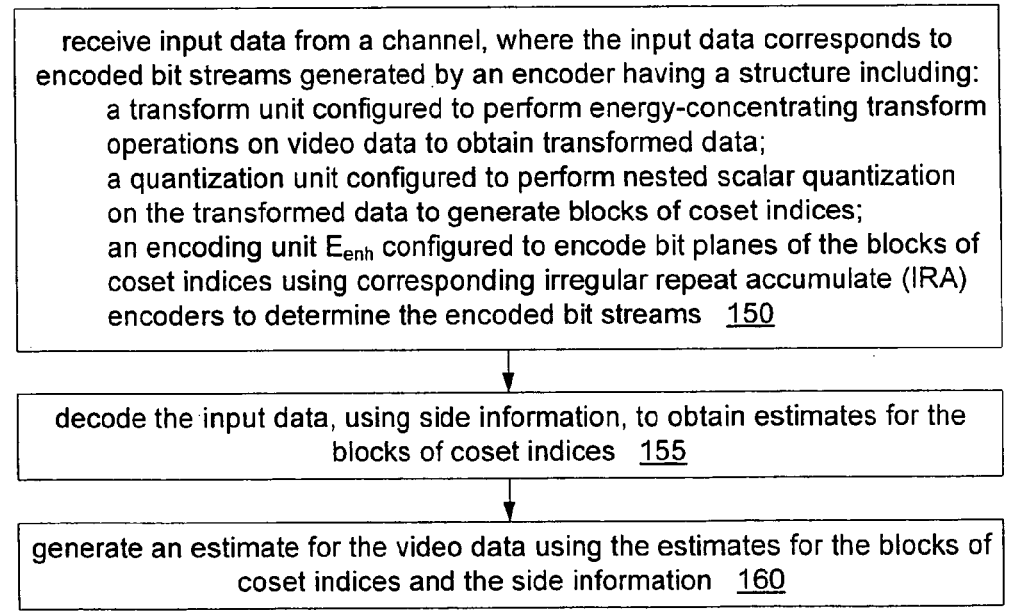
FIG. 1B illustrates one set of embodiments of a method for decoding video data.

In one set of embodiments, a method for video decoding may involve the following actions, as illustrated in FIG. 1B.

At 150, input data U may be received from a channel (e.g., the same channel as described above). The input data U corresponds to encoded bit streams generated by an encoder. The encoder has a structure (or conforms to a block diagram) including:

a transform unit configured to perform energy-concentrating transform operations on video data to obtain transformed data;

a quantization unit configured to perform nested scalar quantization on the transformed data to generate blocks of coset indices; and an encoding unit configured to encode bit planes of the blocks of coset indices using corresponding irregular repeat accumulate (IRA) encoders to determine said encoded bit streams.

The input data U includes $N_C*N_S$ streams of data values. Each data value is $N_u$ bits long, where $N_u$ is a positive integer. In the case where the channel is assumed to be a binary channel (e.g., a binary symmetric channel), the data values may be binary bits, i.e., $N_u=1$. In the case where the channel is an additive white noise channel, the data values may be real values or signed integer values, e.g., $N_u=8, 16, 32, 64$, etc.

Each stream of data values corresponds to one of the $N_C*N_S$ encoded bit streams. Let $P_i$ denote the $i^{th}$ encoded bit stream, $i=1, 2, \ldots, N_C*N_S$. Let $U_i$ denote the corresponding stream of data values. Let $p_{i,j}$ denote the $j^{th}$ bit of the encoded bit stream P. Let denote the $j^{th}$ data value of the stream $U_i$. The data value $u_{i,j}$ can be used to compute a log likelihood ratio $\mu_{par}(i,j)$ for the corresponding bit $p_{i,j}$. (For example, see section 3.2.2 below).

At 155, the input data U may be decoded, using side information, to obtain estimates for the $N_S$ blocks of coset indices originally generated by the quantization unit. The side information is assumed to be correlated with the original video data. For example, the original video data and the side information may be interpreted as sequences of drawings of random variables X and Y respectively, where X and Y are random variables conforming to the expression: $Y=X+Z$, where Z is a random variable representing the noise of a virtual channel connecting X and Y. (Each sample of each frame of the video data may be interpreted as a realization of the random variable X.)

The decoding of the input data U may involve $N_S$ parallel decoding processes. Each decoding process is responsible for generating an estimate for a corresponding one of the $N_S$ blocks of coset indices.

The decoding process for a given block of coset indices may be performed in a progressive fashion. For example, supposing that the block $V_{00}$ corresponds to encoded bit streams $P_1, P_2, \ldots, P_{Nc}$ and that the bit planes of block $V_{00}$ are denoted $B_1, B_2, B_3, \ldots, B_{Nc}$ (in order from most significant bit plane to least significant bit plane), the decoding process for block $V_{00}$ may be performed as follows. The side information and the stream $U_1$ may be used to decode the first (most significant) bit plane $B_1$ of the block $V_{00}$. The side information, the stream $U_2$ and the bit plane $B_1$ may be used to decode the second bit plane $B_2$ of the block $V_{00}$. The side information and the bit planes $B_0$ and $B_1$ may be used to decode the third bit plane $B_2$ of the block $V_{00}$. In general, the side information and the previously decoded bit planes $B_1, \ldots, B_{n-1}$ may be used to decode the $n^{th}$ bit plane $B_n$ of block $V_{00}$. Each of the blocks of coset indices may be decoded in this parallel fashion.

The iterative message-passing algorithm (also referred to as the belief propagation algorithm) may be used to implement each decoding process. As noted above, the scalar values $u_{i,j}$ may be used to compute log likelihood ratios (LLR) for the corresponding bits $p_{i,j}$. Furthermore, the values of the side information may be used to compute LLRs for the blocks of coset indices. The decoding processes may utilize graphs that represent the corresponding IRA encoders.

At 160, output video data (i.e., an estimate of the original video data supplied to the encoder) may be generated using the estimated blocks of coset indices and the side information.

In one set of embodiments, the output video data may be generated as follows. For each coefficient $C_x$ of the $N_S$ transform coefficients (i.e., the coded subset of the $N_L^2$ transform coefficients) of each block of the original video data, given the corresponding estimated coset index $\hat{B}$ and the corresponding transform coefficient $C_y$ of the side information, the maximum likelihood estimator $\hat{C}_x$ of the coefficient $C_x$ may be computed as the expectation of $C_x$ given $\hat{B}$ and $C_y$, i.e., $\hat{C}_x = E(C_x|\hat{B},C_y)$. In one embodiment, we assume the conditional distribution of $C_x$ given $C_y$ is a Gaussian distribution centered at $C_y$ with variance σ (where σ is a parameter that is estimated during correlation estimation, see reference [9]). Thus, $\hat{C}_x$ is computed as the conditional expected value of $C_x$ over the coset with index $\hat{B}$. Each of the remaining transform coefficients (i.e., the coefficients other than the $N_S$ transform coefficients) may be estimated as being equal to the corresponding coefficient of the side information. After the estimated transform coefficients are obtained, the original video data may be estimated by performing an inverse transform (e.g., inverse DCT or inverse KLT).

In various embodiments, we propose a robust layered Wyner-Ziv video coder based on distributed joint source-channel coding, for transmission over error-prone channels (e.g., wireless channels). Instead of protecting compressed Wyner-Ziv video bitstream with a separate error protection coder, our scheme employs a single channel code for both compression (i.e., SWC) and error protection. This is achieved by exploiting parity-based SWC, where parity bits of the Slepian-Wolf channel code, instead of syndrome bits, are sent. Using IRA codes for practical implementation of parity-based SWC, our proposed joint design outperforms a design where the source and channel coding components are treated separately, and comes close to the theoretical limits for transmission over the binary symmetric channel (BSC) and the additive white Gaussian noise (AWGN) channel. Our solution maintains all the advantages of layered Wyner-Ziv video coding as described in [9] (scalability, robustness of the base layer to transmission failures), while providing an effective protection of the enhancement layers from severe noise in the wireless links. Thus, it is an excellent candidate for the emerging multiuser applications such as wireless video surveillance networks and video broadcast/multicast.

It is noted that more accurate statistical distribution modeling may be used to improve the Wyner-Ziv code design. To decrease transmission latency (and thus enable interactive video applications), channel codes that perform well with short block lengths may be employed. It is noted that the inventive principles described herein may be extended to packet erasure channels where a single digital fountain Raptor code is used for both compression and erasure protection.

1 Introduction

Scalable video coding has attracted increased interest recently due to emerging applications such as interactive video, wireless video surveillance networks, video broadcast/multicast, PC cameras, and camera phones. Because the transmission links are often severely corrupted, video compression must be robust to channel noise and packet loss. However, though offering high rate-distortion performance in the noiseless environment, standard video coders (e.g., MPEG and H.264) are very sensitive to packet loss and channel errors, because of error propagation/drifting problems.

Recently, there has been a flurry of activities in practical designs [1, 2] for distributed source coding (e.g., Slepian-Wolf coding [3] and Wyner-Ziv coding [4]) because of its possible applications to video coding and distributed sensor networks. Practical distributed source coding is based on channel coding. The basic idea is to partition all possible source realizations into cosets (bins) of a channel code and transmit only the syndrome of the coset (the index of the bin) to which a specific source realization belongs. Following this approach, several efficient designs have been proposed for Slepian-Wolf coding (SWC) based on LDPC/turbo codes (see [1, 2] and references therein).

Wyner-Ziv coding (WZC) is essentially a source-channel coding problem [2]. The source is first quantized, and then SWC is employed to save the rate. SWC here plays the role of entropy coding in classic source coding. The difference is that, in classic source coding, entropy coding compresses the quantized source to its self entropy, whereas in WZC, SWC compresses the quantized source to its entropy conditioned on side information at the decoder.

Wyner-Ziv video coding [5] is a promising technique for many multiuser emerging applications, because of its error robustness and potentially high rate-distortion performance. Several Wyner-Ziv video coders have been proposed. Girod et al. [5] provided a distributed video compression scheme based on turbo codes and addressed its error resilience property; the scheme is two-layer scalable in the sense of having one base layer and the corresponding turbo parity bits as the enhancement layer. However, the proposed systems incur a substantial rate-distortion penalty compared to standard MPEG-4 coding. Sehgal et al. [6] discussed how coset-based Wyner-Ziv video coding can alleviate the problem of prediction mismatch. Puri and Ramchandran [7] outlined a PRISM framework that swaps the encoder/decoder complexity in standard codecs; however, the output bitstream is not scalable as only one layer is generated for each frame, and the previous decoded frame is used as side information at the decoder.

A layered video coding scheme based on successive refinement for the Wyner-Ziv problem [8] was presented in [9]. Treating a standard coded video as the base layer (or decoder side information), a layered Wyner-Ziv bitstream of the original video sequence is generated to enhance the base layer such that it is still decodable with commensurate qualities at rates corresponding to layer boundaries. Thus this layered WZC scheme in principle resembles MPEG-4 FGS [10] in terms of generating a base layer plus a scalable enhancement layer with good performance.

The main advantage of Wyner-Ziv video coder is its error robustness. Indeed, the MPEG-4 FGS encoder [10] generates the enhancement layer as the difference between the original video and the base layer reconstruction; then at the receiver, the original video is reconstructed by adding an enhancement layer to the recovered base layer. Thus the base layer recovered at the decoder must be identical to that generated at the encoder. Therefore, erroneous symbols in the base layer will cause the loss of synchronization between the encoder and decoder and result in severe error propagation. On the other hand, in WZC of jointly Gaussian sources, separate encoding is as efficient as joint encoding as long as joint decoding is performed at the receiver [4]. So, the enhancement layer can be generated "blindly" at the encoder without knowing the base layer, i.e., side information. Thus, transmission errors in the base layer will less likely cause the encoder-decoder mismatch and therefore, have less impact on the reconstruction of the enhancement layer (see [9]). This makes the Wyner-Ziv video coder robust to errors in the base layer. Still, for reliable transmission, error-free transmission of the enhancement layers must be ensured by the means of error protection coding.

We address this issue and consider transporting layered Wyner-Ziv coded video over error-prone channels. Because of the noise in the channel, we have a distributed source-channel coding problem, where channel coding is needed for compression (i.e., SWC) and also to provide error protection.

A standard way of solving this problem is to concatenate the Wyner-Ziv video coder with a separate channel coder for error protection. In this way, two channel codes are employed: one for SWC and the other for channel coding, and these two codes can be designed independently. A Slepian-Wolf code is designed using the syndrome-based approach of Slepian and Wolf [3] and Wyner [11], and then the resulting syndrome bits are protected with an additional channel code constructed for a particular transmission channel. However, as in classic source-channel coding, separation theorems [12, 13] in distributed source-channel coding have been shown to hold asymptotically (e.g., with infinite code length), distributed joint source-channel coding (JSCC) outperforms separate source-channel coding in practice, and the key lies in efficient code design.

Realizing the important role of channel coding in distributed source coding and the need of channel coding for error protection in distributed source-channel coding, we adopt a single channel code for both SWC and error protection in a distributed JSCC setup. The main idea is to explore parity-based approach for SWC, that is, to index the bins in the SWC scheme by parity bits instead of syndrome bits of a channel code. We show that this approach suffers higher complexity than syndrome-based SWC in the noiseless case, while the offered performance is the same. However, for transmission over noisy channels parity-based SWC is more efficient because in contrast to the syndromes, parity bits can protect.

Specifically, we propose to employ a special class of low-density parity-check (LDPC) codes called irregular repeat-accumulate (IRA) codes [14] to achieve both Slepian-Wolf compression and error protection, because IRA codes are well suited for distributed JSCC (see [15]). The standard coded video (or base layer) can be viewed as the systematic part of the IRA code, transmitted through the "virtual" correlation channel; on the other hand, the Wyner-Ziv coded bitstream is the parity part of the IRA code transmitted through the real noisy channel. Then advanced design techniques (e.g., density evolution using Gaussian approximation [14]) can be employed to optimize the IRA code according to different conditions on both channels. Compared to the traditional video transmission systems which use separate forward error correction coding, our system enables one integrated design of both source and channel coding for different channel conditions and provides better rate-distortion performance. The experiments show that our proposed practical robust layered Wyner-Ziv video coder performs only 0.05 bits per sample (bit/s) away from the theoretical limit over the additive white Gaussian noise channel with signal-to-noise ratio 1 dB.

The paper is organized as follows. In Section 2 we describe and compare syndrome-base and parity-based SWC. In Section 3, we review the layered Wyner-Ziv video coder of [9] and propose a novel video coding scheme for scalable video transmission over noisy channels based on distributed JSCC. In Section 4 we show our experimental results.

2 Practical Slepian-Wolf Coding

Slepian and Wolf [3] showed that lossless compression of two separate, discrete, memoryless sources X and Y can be as efficient as if they were compressed together, as long as joint decoding is done at the receiver. The minimum rates, Rx and Ry, for compressing X and Y, respectively, are given by:

$$R_X \geq H(X|Y), R_Y \geq H(Y|X), R_X + R_Y \geq H(X,Y). \tag{1}$$

In WZC, we exploit the case of asymmetric SWC [16], or source coding with side information, where one source, e.g., Y, is available at the receiver (or equivalently, is sent at the entropy rate $H(Y)$), and the task of the encoder is to approach the conditional entropy limit H(X|Y) in compressing the second source X. Asymmetric SWC attempts to reach two corner points, i.e., (H(X|Y), H(Y)) and (H(Y|X), H(X)), on the Slepian-Wolf bound; all other rate points on the bound can be approached using time-sharing.

The achievability of the Slepian-Wolf theorem is based on random binning [17]. For the corner point, the main idea is to partition the space $X^n$ of x into $2^{nR_x}$ disjoint sets (bins) and randomly assign every source realization $x \in X^n$ to one of $2^{nR_x}$ bins. The encoder then transmits the index of the bin to which the source realization belongs. Given the received bin index, the decoder searches in the bin for a jointly typical (x, y) pair, where y is the realization of side information. If it succeeds to find such a unique pair, it reconstructs the sources as $\hat{x}=x$; otherwise an error is declared. The proof of the Slepian-Wolf theorem shows that a coding scheme that can reach the Slepian-Wolf bound exists, but does not show how to construct such a scheme.

Practical SWC is based on algebraic binning [18] constructed via channel codes. We distinguish two methods for realizing algebraic binning. The first one is syndrome-based scheme rooted in the original work of Slepian and Wolf [3] and Wyner [11]. The second method, we call parity-based scheme. Though both methods exploit linear channel codes for algebraic binning, they differ in the distribution of the codewords into the bins. The two methods are equivalent in the noiseless environment, i.e., when the coded bitstream is delivered error-free to the decoder. However, if the compressed bits are transmitted over a noisy channel, then the syndrome-based scheme becomes inefficient.

In this section, we describe and compare the syndrome-based and parity-based scheme and point out the advantages of the latter for transmission over noisy channels.

First, a word about notation. Random variables are denoted by capital letters, e.g., X, Y. They take values from finite alphabets X, Y. Realizations of random vectors of finite length n bits $X^n, Y^n$ are denoted by bold-face lower-case letters, e.g., $(x, y) \in (X^n, Y^n)$. Matrices are denoted by bold-face upper-case letters; the size of a matrix will often be given as a subscript; $I_k$ and $0_{k_1 \times k_2}$ are k×k identity matrix and $k_1 \times k_2$ all-zero matrix, respectively. All variables and channel codes are binary.

2.1 Transmission Over Noiseless Channels

Let $\{X_i, Y_i\}_{i=1}^{\infty}$ be a sequence of independent drawings of a pair of independent, identically distributed (i.i.d.), discrete, correlated binary random variables (X, Y). The task is to compress X and transmit the resulting bitstream over a noiseless channel to a decoder which has access to side information Y. From the Slepian-Wolf theorem [3] we know that the achievable rate for this distributed source coding problem is $R_X \geq H(X|Y)$.

It is convenient to look at the correlation between the source $X^n$ and side information $Y^n$ as a communication channel (called "virtual" correlation channel) [2]; X=Y+Z, where i.i.d. random variable Z is the "noise" independent of Y. For simplicity, we assume that Z is a Bernoulli-p, that is, the correlation channel is the binary symmetric channel (BSC) with crossover probability p.

Wyner [11] suggested realization of the binning scheme using channel codes, where each bin is a coset [19, 20] of a good parity-check code indexed by its syndrome. To compress $X^n$, a syndrome-based encoder employs an (n, k) linear channel code C, given by generator matrix $G_{k \times n} = [I_k\ P_{k \times (n-k)}]$. (For simplicity we assume that C is systematic.) The (n−k)×n parity matrix is given by $H_{(n-k) \times n} = [P_{k \times (n-k)}^T\ I_{n-k}]$. Then, the encoder forms (n−k)-length syndrome vector $s = xH^T$ and sends it to the decoder. The decoder generates an n-length vector $t = [0_{1 \times k}\ s]$ by appending zeros to the received syndrome s. Note that $c = x \oplus t$ is a valid codeword of C. By decoding $t \oplus y$ on C a codeword $\hat{c}$ is obtained; and the source is reconstructed as $\hat{x} = \hat{c} \oplus t$.

The syndrome-based approach is optimal for the Slepian-Wolf problem, in the sense that if a linear channel code C approaches capacity of the "virtual" correlation channel X=Y+Z, then it will also approach the Slepian-Wolf limit. Note that to satisfy the Slepian-Wolf limit, $R_X \geq H(X|Y)$, we must ensure $k \leq n(1-H(X|Y))$. Then, the coderate of the employed code C must satisfy $r_{s_c} = k/n \leq 1-H(X|Y)$. Since all the bins are coset codes of C with the same distance property, probability of decoding error depends solely on the error protection capability of C.

In the syndrome-based approach, each bin is indexed by a syndrome of a channel code. However, one can instead use parity-check bits to index the bins. We call this scheme the Parity-based SWC scheme. To compress the source $X^n$, a parity-based encoder employs an (n+r, n) linear systematic channel code $C^p$ with generator matrix $G^p_{n \times (n+r)} = [I_n\ P^p_{n \times r}]$. The encoder forms r-length parity vector $p = xP^p$ and transmits it to the decoder. The decoder generates an (n+r)-length vector $t^p = [y_{1 \times n}\ p]$ by appending the side information $y_{1 \times n}$ to the received vector p. By decoding $t^p$ on $C^p$, the decoder obtains $\hat{c}^p = \hat{x}G^p$, and its systematic part is the source reconstruction $\hat{x}$.

If an (n+r, n) linear channel code $C^p$ approaches capacity of the "virtual" correlation channel X=Y+Z, then it will also approach the Slepian-Wolf limit. The Slepian-Wolf theorem now asserts $r \geq nH(X|Y)$. Thus, the employed linear channel code $C^p$ is of coderate $$r_{p_r} = n/(n+r) \leq \frac{1}{1+H(X|Y)}.$$

Since $H(X|Y) \leq 1$, limit-approaching codes have coderate no less than ½. To achieve the same compression with the syndrome-based and parity-based schemes the coderate of the employed codes C and $C^p$ should be such that r=n−k. The two approaches are equivalent and generate the same encoder output if $H^T = P^p$.

Although similar, the two described approaches have a fundamental difference. C is an (n, k) code, and thus its codewords are of length n bits. On the other hand, $C^p$ is an (n+r, k)=(2n−k, k) code with codewords of length 2n−k, but only the systematic part (which is of length n bits) is affected by the "errors" of the correlation channel, whereas the parity part is always "error-free". Thus the parity-based approach suffers extra complexity due to a longer channel codeword length. On the other hand, if $H^T = P^p$, then performance of the syndrome-based and parity-based approaches is the same; that is, no coding gain is achieved due to a longer codeword length in the parity-based scheme. That is why, we conclude that the syndrome-based scheme is optimal for the (noiseless) Slepian-Wolf problem: it can approach the conditional entropy limit with the shortest channel codeword length.

The syndrome-based scheme with LDPC codes was exploited in [9] for layered Wyner-Ziv coding over noiseless channels.

2.2 Transmission Over Noisy Channels

We now assume that the output bitstreams of the Slepian-Wolf encoder are sent over a noisy channel. It is here where the extra redundancy of the parity-based scheme is exploited.

When the channel is noisy in the Slepian-Wolf problem, source-channel coding with side information is needed. The single-user separation theorem put forth by Shannon in 1948 [21] implicitly states that reliable transmission can be accomplished by separate source and channel coding. The separation theorem in distributed source-channel coding, proved in [12], asserts that if the decoder has side information Y of uncoded source X, then the entropy of the source H(X) in the standard separation theorem is replaced by H(X|Y), the conditional entropy of the source given side information. Equivalently, the theoretical limit in this noisy channel case is $R_X > H(X|Y)/C$, where $C \leq 1$ is the channel capacity. An extension to lossy source-channel coding with side information is given in [13].

Recall that the output of a syndrome-based Slepian-Wolf encoder are channel code syndrome bits which can only compress but not protect. Therefore, first the syndrome-based encoder should be used to perform Slepian-Wolf compression and then the resulting Slepian-Wolf coded bits should be protected with a channel code against the distortion they are going to encounter when transmitted through the noisy channel. Thus, in this design, two channel codes are needed: one for SWC (that is, for source coding) and the other for channel protection (that is, for error-correction coding). So, the syndrome-based approach requires separate designs of the source and channel coding component as depicted in FIG. 2. However, although separate designs are asymptotically optimal, practical designs are expected to perform better when employing distributed JSCC [12].

Since SWC is essentially channel coding [2], it is more meaningful to combine the two channel codes, the one used for SWC and the one used for error protection, into a single channel code and use only this channel code for joint source-channel coding with side information. This can be achieved with the parity-based SWC scheme described in the previous subsection, because in contrast to syndrome bits, parity bits can protect. Indeed, if the amount of generated parity bits increases above the Slepian-Wolf limit, the added redundancy can be exploited for protection. Thus we view the source-channel coded bits as the parity bits of a systematic channel code and consider an equivalent channel coding problem over two channels. The first channel is the transmission noisy channel through which the output bits of the parity-based Slepian-Wolf encoder are sent to the decoder, and it describes the distortion experienced by the parity bits of the code. The second channel is the "virtual" correlation channel between the source (the systematic bits of the channel code) and the side information available at the decoder.

The construction of an (n+r, n) systematic channel code for this distributed JSCC problem is the same as in the noiseless case, only the parameter r should be selected so that $r \geq nH(X|Y)/C$. Decoding is done by generating an (n+r)-length vector $\bar{r}^p = [y_{1 \times n} \ \bar{p}]$, where $\bar{p}$ is the received parity vector. By decoding $\bar{r}^p$ on $C^p$, the decoder obtains $\hat{c}^p = \hat{x}G^p$ and reconstructs $\hat{x}$ as the systematic part of $\hat{c}^p$.

3 Robust Layered Wyner-Ziv Video Coding

In this section we first review the layered Wyner-Ziv video coder of [9], proposed for communication over noiseless channels, which exploits syndrome-based SWC based on LDPC codes. To apply this scheme to real-world wireless systems, a separate channel coder must be added to protect vulnerable (Slepian-Wolf coded) video output from severe noise. However, instead of taking this separate approach where compression and protection are independently realized with two different channel codes, we will, later in the section, propose a novel layered Wyner-Ziv video coder which jointly performs Slepian-Wolf compression and error protection using a single IRA code.

3.1 Layered Wyner-Ziv Video Coding for Noiseless Channels

Following the layered Wyner-Ziv code design for ideal Gaussian sources of [22], Xu and Xiong [9] presented a practical layered Wyner-Ziv coder for real video sources shown in FIG. 3. A standard video coder is used to generate a base layer at a low rate. Treating the decoded base layer as side information Y at the decoder, a layered Wyner-Ziv bitstream of the original video is generated to enhance the base layer such that it is still decodable with commensurate qualities at rates corresponding to layer boundaries. The Wyner-Ziv encoder includes three components: the conditional Karhunen-Loève Transform (cKLT) [23] or DCT, nested scalar quantization (NSQ) [18], and syndrome-based Slepian-Wolf coder. The first two components are similar to their counterparts in standard video coding. After NSQ of the DCT coefficients, there is still correlation between the obtained coset indices and the side information. Thus, SWC can be used to reduce the rate; in [9] multi-level LDPC codes are employed for practical realization of syndrome-based SWC, and the result is one compressed bitstream (enhancement layer) for each NSQ output bitplane. The scheme shows excellent rate-distortion performance when the channel is noiseless [9]. However, generated output bitstreams are very sensitive to transmission errors, and additional channel protection coding is necessary.

3.2 Layered Wyner-Ziv Video Coding for Noisy Channels

As discussed in Section 2, for transmission over noisy channels, a single parity-based SWC scheme can be used. Thus, instead of protecting Slepian-Wolf compressed bitstreams (the output of the Wyner-Ziv video coder [9]) with a separate channel code, we take another approach and replace the syndrome-based SWC scheme by a parity-based one, which jointly performs video compression (i.e., SWC) and channel protection.

Practical designs for parity-based SWC over error-prone channels, or distributed JSCC, based on advanced channel codes have been proposed in [15, 24, 25, 26]. For example, the design of [15] exploits systematic IRA codes for JSCC with side information at the decoder of a memoryless binary source X, where X and side information Y are correlated with $P(X \neq Y) = p$. The main idea underlying the scheme of [15] is to view the system as transmitting the source over two channels (see FIG. 4): the first one is the actual noisy channel through which the encoder output bits, P, are sent to the decoder and describes the distortion experienced by the parity bits of the IRA code; the second channel is the "virtual" correlation channel between the source and side information. Systematic IRA codes are used as the source-channel codes and designed using the Gaussian approximation [14] by taking into account the two different channel conditions. Results in [15] are better than previously published for transmission over binary symmetric, Gaussian, and Rayleigh fading channels.

The systematic IRA codes are well suited for distributed JSCC because parity bits instead of syndrome bits can be generated without sacrificing compression efficiency; moreover, both channels can be considered in the design of a bigger size code for improved error robustness. IRA codes were introduced in [14] where it was shown that they can achieve capacity on the erasure channel and can perform very close to the capacity on the binary input additive white Gaussian noise (AWGN) channel. Systematic IRA codes have the advantages of both LDPC codes (message-passing iterative decoding) and turbo codes (linear time encoding). An ensemble of IRA codes is described by the degree distribution polynomials $\lambda(x) = \sum_{i=2}^{J} \lambda_i x^{i-1}$ and $\rho(x) = \sum_{i=2}^{M} \rho_i x^{i-1}$, where $\lambda_i$ and $\rho_i$ are the fraction of edges incident on information nodes and check nodes with degree i, respectively. A specific IRA code is determined by its bipartite graph, which specifies the connections between the bit nodes and the check nodes. An example of the bipartite graph of an IRA code is shown in FIG. 5.

We only consider IRA codes in their systematic form, that is, the codeword corresponding to information bits $\{x_1, \ldots, x_k\}$ is given by $\{x_1, \ldots, x_k, p_1, \ldots, p_r\}$, where $\{p_1, \ldots, p_r\}$ are parity bits. We assume that the check degrees are concentrated, i.e., $\rho(x)=x^{\alpha-1}$ for some integer $\alpha$. Then, given the degree distribution polynomial $\lambda(x)$ and $\alpha$, the rate of the code is $$R = \frac{\sum_i \lambda_i/i}{1/\alpha + \sum_i \lambda_i/i}.$$

FIG. 6 depicts the block diagram of the proposed robust layered Wyner-Ziv video coder. The video sequence X is encoded with a standard video coder (e.g., H.26L) to generate a base layer, which is transmitted over a (error-free) channel to the receiver. At the receiver, the base layer is decoded, and the resulting sequence Y (decoder side information) is regarded as the received systematic part of the IRA code. The Wyner-Ziv coded bitstream is the parity part, P, of the IRA code and is transmitted through the noisy channel. At the decoder, the distorted Wyner-Ziv coded bit sequence (due to the noise from the actual channel), U, is combined with Y to perform joint source-channel decoding. In other words, both the systematic part and the parity part of the IRA code are used to perform systematic channel decoding.

The Wyner-Ziv encoder includes three components: the cKLT/DCT, NSQ [18, 27], and distributed JSCC (i.e., parity-based SWC). We employ multi-level IRA codes for distributed JSCC in the third component of the encoder and output one layer of parity bits for each bitplane after NSQ. The IRA code-based bitplane coding for distributed JSCC not only exploits the correlation between the quantized version of the source X and the side information Y, but also provides error protection for the parity bits that are transmitted through the noisy channel. At the decoder, the received parity bits of each layer are combined with previously decoded bitplanes to decode a new bitplane before the joint estimation of the output video. Note that this multi-level decoding scheme achieves progressive decoding because the decoded video quality gradually improves upon receiving more layers of parity bits.

We assume that the base layer is delivered error free to the decoder. This can always be achieved with strong channel coding. However, the proposed scheme can also be used when the base layer is transmitted through a noisy channel without channel coding as well; indeed, as it will be shown in the next section, even a corrupted base layer can be exploited for the reconstruction of the Wyner-Ziv coded enhancement layers. This case can be viewed as sending systematic bits of the IRA code through a concatenation of the "virtual" correlation channel and the actual transmission channel.

3.2.1 Encoding

After NSQ of X, there is correlation between the quantized version of X (denoted by B in FIG. 6) and side information Y. IRA codes are employed then for parity-based SWC to reduce the transmission rate to the theoretical rate limit $R=H(B|Y)/C$, where C denotes the capacity of the transmission channel.

We express B in its binary representation as $B=B_0B_1\ldots B_n$, where $B_0$ is the most significant bit and $B_n$ is the least significant bit. Each bitplane of DCT coefficients is then coded independently using multilevel IRA codes. The minimum rate of the IRA code for coding $B_i$ ($0 \leq i \leq n$) is given by $H(B_i|Y, B_{i-1}, \ldots, B_0)/C$ [15] (this is the minimum rate needed for lossless recovery of $B_i$ given Y and $B_{i-1} \ldots B_0$ at the decoder over the noisy channel with capacity C). By the chain rule $H(B|Y)/C=H(B_0|Y)/C+H(B_1|B_0, Y)/C+\ldots+H(B_n|B_0, B_{n-1}, Y)/C$. So layered coding suffers no rate loss when compared with monolithic coding.

Given a realization of the bipartite graph with degree distribution $\lambda(x)$ and $\rho(x)=x^{\alpha-1}$, the encoding of an input information sequence of length k is performed by mapping the bit nodes to the parity nodes, generating a binary sequence of length $$r = \frac{k}{\left(\alpha \sum_i \lambda_i/i\right)}.$$

For each bitplane, only the parity bits of the IRA encoded codeword are sent.

3.2.2 Joint Decoding

At the decoder, the received signal U, corresponding to the parity bits, from the noisy channel and the "corrupted" systematic bits, Y (the base layer) are combined to perform systematic IRA channel decoding. The message-passing algorithm [14] is used for iterative IRA decoding. The received bits correspond to the parity nodes of the bipartite graph, while the side information and the previously decoded bitplanes provide the a priori information to the information nodes. Therefore, the log-likelihood ratio (LLR) of the jth systematic bit at the ith layer is $$\mu_{sys}^{i,j} = LLR_{sys}^{(i,j)} = \log\frac{p(B_{i,j}=0 \mid Y, \hat{B}_0, \ldots, \hat{B}_{i-1})}{p(B_{i,j}=1 \mid Y, \hat{B}_0, \ldots, \hat{B}_{i-1})}. \quad (2)$$

The LLR of the jth parity bit at the ith layer depends on the received value of the parity bits $u_{i,j}$ and the actual channel condition. For example, for a BSC with crossover probability q, $$\mu_{par}^{(i,j)} = LLR_{par}^{(i,j)} = \log\frac{p(p_{i,j}=0 \mid u_{i,j})}{p(p_{i,j}=1 \mid u_{i,j})} \quad (3)$$

$$= (1-2u_{i,j})\log\frac{1-q}{q},$$

where $p_{i,j}$ denotes the transmitted jth parity bit at the ith layer. Then the message-passing algorithm [14] is used for iterative IRA decoding.

After decoding of the ith layer, both the decoded bitplane and side information Y are fed into the decoder for the decoding of subsequent bitplanes. Since the allocated bit rate for coding $B_i$ is $H(B_i|Y, B_0, \ldots, B_{i-1})/C$, $B_i$ can be correctly decoded as long as $B_0, \ldots, B_{i-1}$ are correctly recovered. The more enhancement layers the decoder receives (or the higher the bit rate is), the more bitplanes of B will be recovered, and the reconstruction of X will be better.

3.2.3 Code Design

The possibility of designing systematic IRA codes with different channel conditions for the systematic and parity part is the main advantage of using IRA codes in parity-based SWC.

If we suppose that the correlation channel and the actual transmission channel are the same and are AWGN channels, the code degree distribution polynomials of the systematic IRA codes can be optimized using Gaussian approximation. We start by defining the function $$\phi(t) = \frac{1}{\sqrt{4\pi t}} \int_{-\infty}^{\infty} \tanh\left(\frac{a}{2}\right) e^{-(a-t)^2/4t} \, da. \quad (4)$$

Assuming that the maximum allowable systematic node degree is J, the linear optimization of the systematic node degree distribution $\lambda(x) = \sum_{i=2}^{J} \lambda_i x^{i-1}$ for a given check node degree distribution $\rho(x) = x^{\alpha-1}$ is done by maximizing $$\sum_{i=2}^{J} \frac{\lambda_i}{i}$$

subject to the condition [14]

$$\lambda(1) = 1, \quad (5)$$

$$F(x) > x, \, \forall x \in [x_0, 1], \quad (6)$$

where F(x) is defined as [14]

$$F(x) = \sum_{i=1}^{J} \lambda_i \phi\left(\mu_{sys} + (i-1)\phi^{-1}\left(\frac{\phi^2(f(x))}{x^{\alpha+1}}\right)\right), \quad (7)$$

and $x_0 = \phi(\mu_{sys})$. The function $f(x)$ is determined from the equation $\phi(f(x)) = x^+ \phi(\mu_{par} + f(x))$ [14]. The systematic part and the parity part have the same channel $$LLR \; \mu_{sys} = \mu_{par} = 4\frac{E_s}{N_0} \text{ where } \frac{E_s}{N_0}$$

is the energy per symbol per noise power spectral density since they are transmitted through the same Gaussian channel.

Now we apply this design process using Gaussian approximation to distributed JSCC over two different channels: Suppose that the correlation channel is an AWGN channel and the transmission channel is a BSC; as the BSC can be viewed as an AWGN channel with quantized output, an approximate way to design the code [15] is to map first the BSC parameters to that of the AWGN channel and then to use the process outlined above. The mapping is based on the equality of the stability functions for the two channels [15] [28]

$$\left(\frac{E_s}{N_0}\right) eq = -\log\left(2\sqrt{q(1-q)}\right), \quad (8)$$

where q is the crossover probability of the BSC and $$\left(\frac{E_s}{N_0}\right) eq$$

is the equivalent AWGN channel parameter. Using this we can compute the initial LLRs $\mu_{sys}$ and $\mu_{par}$ in the above linear optimization. In a similar way one can apply this design process to the case when the transmission channel is a Rayleigh flat-fading channel.

4 Experiment Results

In this section we report our simulation results. First, for uniform, binary, memoryless sources, we compare syndrome-based and parity-based SWC for transmission over an AWGN channel. Results together with the theoretical limits are shown in FIG. 7. The correlation between the source and side information is a BSC with crossover probability p. One hundred blocks of $10^5$ bits each are simulated to compute the average bit error rate (BER). The encoded bitstreams are transmitted over an AWGN channel with signal-to-noise ratio (SNR) −5.02 dB. The separate design exploits an LDPC code of coderate 0.35 for syndrome-based SWC; then, an IRA code of coderate 0.325 is used to protect LDPC coded syndromes from the noise in the AWGN channel; thus the overall transmission rate is ½. The profiles of the employed LDPC and IRA codes are optimized using Gaussian approximation and are: $\lambda(x) = 0.245434x^2 + 0.192124x^3 + 0.135732x^6 + 0.083899x^7 + 0.11166x^{13} + 0.00298276x^{15} + 0.0222593x^{18} + 0.0742901x^{29} + 0.131619x^{33}$, $\rho(x) = 0.5x^6 + 0.5x^7$ for the LDPC code and $\lambda(x) = 0.220995x^3 + 0.192528x^{11} + 0.148133x^1 + 0.438109x^{26} + 0.000222x^{27} + 0.000009x^{28} + 0.000001x^{29}$, $\rho(x) = x^4$ for the IRA code.

On the other hand, the joint design exploits a single IRA code with coderate ½ for parity-based SWC. The profile of the used IRA code is from [15]: $\lambda(x) = 0.19759x^3 + 0.00483x^{11} + 0.28033x^{12} + 0.51725x^{50}$, $\rho(x) = x^5$. 200 iterations are performed for iterative IRA decoding for both the separate and the joint design. From the figure, it can be seen that the joint design outperformed the separate approach for almost 0.1 bit at the average residual BER of $10^{-5}$. The loss to the theoretical limit was only 0.1 bit.

In the next experiments, we test the proposed layered Wyner-Ziv video coder described in Section 3.2 for transmission over an AWGN channel and a BSC. We use the standard CIF "Foreman" and "Mother & daughter" video sequences and encode 300 frames at rate 30 frames/second. Standard H.26L video coder [29] is exploited to generate the base layer (decoder side information). 20 frames are grouped and coded as one group of frames (GOF) each consisting of an I frame followed by 19 P frames. H.26L coder uses different quantization stepsizes to generate base layers at different compression ratios. The base layer is delivered to the destination without errors.

Enhancement layers are generated using WZC, where the correlation between source X and side information Y is modeled as jointly Gaussian (in the DCT domain). After DCT of the original video, we only code the first three transform coefficients (i.e., DC and the first two AC coefficients). For each transform coefficient, we use a four-bit nested scalar quantizer (with nesting ratio N=16) to generate four bitplanes. The 12 bitplanes are then encoded by 12 different IRA codes. Only resulting parity bits are sent over a noisy channel. The coderate, r, of each IRA code is determined from $$r \leq \frac{1}{1 + H(B_i \mid Y, B_{i-1}, \ldots, B_0)/C},$$

where i={0, 1, 2, 3} is the bitplane number, and C is the capacity of the transmission channel. The codeword lengths of the 12 IRA codes for each GOF are the same, but the codeword lengths for different GOFs are different and they range from 70 to 110 kilobits (Kb) depending on the amount of motion in each GOF. Each IRA code is designed using Gaussian approximation [14] based on different channel conditions on the correlation channel and the actual channel. At the destination, the received parity bits from the actual channel and the side information Y are combined to perform sequential IRA decoding with 100 iterations.

FIGS. 8 and 9 show obtained average peak signal-to-noise ratio (PSNR) of the reconstructed video as a function of the transmission rate for the "Foreman" and "Mother & daughter" video sequences, respectively. The actual channel is the BSC with crossover probability 0.05. Note that as the bit rate increases and more bitplanes are received, the decoded video quality gradually improves. Compared to the theoretical limit (ideal channel coding at transmission rate R=H(B|Y)/C), the loss due to practical distributed JSCC with IRA codes is approximately 0.07 bit/s. Similar results were obtained for other crossover probabilities of the transmission channel. We also observed that by decreasing the crossover probability the loss to the theoretical limit decreases.

Results for the AWGN channel with SNR equal to 1 dB are shown in FIGS. 10 and 11. The loss of our proposed video coder due to practical distributed JSCC is now only 0.05 bit/s. The smaller loss in this case compared to the transmission over the BSC is mainly due to Gaussian approximation used in the IRA code design process (see Section 3.2.3). Similar results were obtained for different SNRs.

For the first 20 frames of the "Foreman" video sequence with the rate of the base layer equal to 480 Kbps, the theoretical rate limits and the actual transmission rates for each bitplane after NSQ of the DC component and the first two AC components of the DCT coefficients are listed in the table shown in FIG. 12. The transmission channel is the AWGN channel with SNR equal to 1 dB. Note that the actual transmission rate is $1/r-1$, where r is the coderate of the used IRA code. The quantization stepsize for NSQ is q=32.

Finally, we investigate the performance of our proposed video coder when the base layer is transmitted over the erasure channel. The results for the "Foreman" video sequence and four different bit rates of the base layer are presented in FIG. 13. Each macroblock of the base layer is erased with probability 0.01; four enhancement layers are transmitted over the AWGN channel with SNR equal to 1 dB. It can be seen that, though the base layer (decoder side information) is corrupted, decoding the first three enhancement layers still gradually improves the performance. The last enhancement layer usually cannot help. Note that, the loss compared to the case when the side information is perfect ranges from 2 to 4 dB, and it mainly remains constant regardless of the number of received enhancement layers. Thus, we conclude that our scheme does not suffer from the error propagation/error-drifting problem.

REFERENCES

[1] S. Pradhan, J. Kusuma, and K. Ramchandran, "Distributed compression in a dense microsensor network," *IEEE Signal Processing Magazine*, vol. 19, pp. 51-60, March 2002.

[2] Z. Xiong, A. Liveris, and S. Cheng, "Distributed source coding for sensor networks," *IEEE Signal Processing Magazine*, vol. 21, pp. 80-94, September 2004.

[3] J. D. Slepian and J. K. Wolf, "Noiseless coding of correlated information sources," *IEEE Trans. Inform. Theory*, vol. 19, pp. 471-480, July 1973.

[4] A. Wyner and J. Ziv, "The rate-distortion function for source coding with side information at the decoder," *IEEE Trans. Inform. Theory*, vol. 22, pp. 1-10, January 1976.

[5] B. Girod, A. Aaron, S. Rane, and D. Rebollo-Monedero, "Distributed video coding," *Proc. of the IEEE*, vol. 93, pp. 71-83, January 2005.

[6] A. Sehgal, A. Jagmohan, and N. Ahuja, "Wyner-Ziv Coding of Video: Applications to Error Resilience," *IEEE Trans. Multimedia*, vol. 6, pp. 249-258, April 2004.

[7] R. Puri and K. Ramchandran, "PRISM: A video coding architecture based on distributed compression principles," submitted to *IEEE Trans. Image Processing*, 2003.

[8] Y. Sterinberg and N. Merhav, "On successive refinement for the Wyner-Ziv problem," *IEEE Trans. Inform. Theory*, vol. 50, pp. 1636-1654, August 2004.

[9] Q. Xu and Z. Xiong, "Layered Wyner-Ziv video coding," submitted to *IEEE Trans. Image Processing*, July 2004.

[10] W. Li, "Overview of fine granularity scalability in MPEG-4 video standard", *IEEE Trans. Circuits and Systems for Video Tech.*, vol. 11, pp. 301-317, March 2001.

[11] A. Wyner, "Recent results in the Shannon theory," *IEEE Trans. Inform. Theory*, vol. 20, pp. 2-10, January 1974.

[12] S. Shamai (Shitz) and S. Verdu, "Capacity of channels with side information," *European Transactions on Telecommunications*, vol. 6, no. 5, pp. 587-600, September-October 1995.

[13] S. Shamai, S. Verdu, and R. Zamir, "Systematic lossy source/channel coding," *IEEE Trans. Inform. Theory*, vol. 44, pp. 564-579, March 1998.

[14] H. Jin, A. Khandekar, and R. McEliece, "Irregular repeat-accumulate codes," in Proc. 2nd Int. Symp. on Turbo codes, Brest, France, September 2000.

[15] A. D. Liveris, Z. Xiong, and C. Georghiades, "Joint source-channel coding of binary sources with side information at the decoder using IRA codes," in Proc. Multimedia Signal Processing Workshop, St. Thomas, US Virgin Islands, December 2002.

[16] V. Stanković, A. Liveris, Z. Xiong, and C. Georghiades, "Design of Slepian-Wolf codes by channel code partitioning," in Proc. DCC-2004 Data Compression Conference, Snowbird, Utah, March 2004.

[17] T. Cover and J. Thomas, *Elements of Information Theory*, New York: Wiley, 1991.

[18] R. Zamir, S. Shamai, and U. Erez, "Nested linear/lattice codes for structured multiterminal binning," *IEEE Trans. Inform. Theory*, vol. 48, pp. 1250-1276, June 2002.

[19] G. D. Formey Jr., "Coset codes-I: Introduction and geometrical classification," *IEEE Trans. Inform. Theory*, vol. 34, pp. 1123-1151, September 1988.

[20] G. D. Forney Jr., "Coset codes-II: Binary lattices and related codes," *IEEE Trans. Inform. Theory*, vol. 34, pp. 1152-1187, September 1988.

[21] C. E. Shannon, "A mathematical theory of communication," *Bell Syst. Tech. J., vol.* 27, pt. I, pp. 379-423, 1948; pt. II, pp. 623-656 1948.

[22] S. Cheng and Z. Xiong, "Successive refinement for the Wyner-Ziv problem and layered code design," in Proc. DCC-2004 Data Compression Conference, Snowbird, Utah, April 2004.

[23] M. Gastpar, P. Dragotti, and M. Vetterli, "The distributed Karhunen-Loève transform," submitted to *IEEE Trans. Inform. Theory, November* 2004.

[24] A. Aaron and B. Girod, "Compression with side information using turbo codes," in Proc. DCC-2002 Data Compression Conference, Snowbird, Utah, April 2002.

[25] J. Garcia-Frias, "Joint source-channel decoding of correlated sources over noisy channels," in Proc. DCC-2001 Data Compression Conference, Snowbird, Utah, March 2001.

[26] P. Mitran and J. Bajcsy, "Turbo source coding: A noise-robust approach to data compression," in Proc. DCC-2002 Data Compression Conference, Snowbird, Utah, April 2002.

[27] Z. Xiong, A. Liveris, S. Cheng, and Z. Liu, "Nested quantization and Slepian-Wolf coding: A Wyner-Ziv coding paradigm for i.i.d. sources," in Proc. IEEE Workshop on Statistical Signal Processing, St. Louis, Mo., September 2003.

[28] S.-Y. Chung, On the *Construction of Some Capacity-Approaching Coding Schemes*, Ph.D. dissertation, Massachusetts Institute of Technology, 2000.

[29] T. Wiegand, "H.26L test model long-term number 9(tml-9) draft0," ITU_T Video Coding Experts Group, VCEG-N83d1, December 2001.

[30] Q. Xu, V. Stanković, A.D. Liveris, and Z. Xiong, "Distributed joint source-channel coding of video," to apper in Proc. ICIP-2005 IEEE Interanational Conference on Image Processing, Genova, Italy, September 2005.

What is claimed is:

1. A method comprising:
   performing energy-concentrating transform operations on a group of frames of video data to obtain transformed data;
   performing nested scalar quantization on the transformed data to generate a block of coset indices;
   computing rate limits for bit planes of the block of coset indices;
   determining parity-based irregular repeat accumulate (IRA) encoders, configured to index bins using parity check bits, for the bit planes using the rate limits;
   encoding the bit planes using the IRA encoders to generate corresponding parity bit streams, including parity bin indexes; and
   transmitting the parity bit streams including the parity bin indexes, to a destination device over a channel.

2. The method of claim 1 further comprising:
   encoding a version of the video data, wherein said version has a lower image quality than the video data;
   transmitting the encoded version of the video data to the destination device over the channel.

3. The method of claim 1, wherein each of the IRA encoders is optimized to perform both source coding and error protection coding on a corresponding one of the bit planes.

4. The method of claim 1, wherein the energy-concentrating transform operations are discrete cosine transform (DCT) operations.

5. The method of claim 1, wherein the energy-concentrating transform operations are Karhunen-Loève transform operations.

6. A system comprising:
   a transform unit configured to perform energy-concentrating transform operations on a group of frames of video data to obtain transformed data;
   a quantization unit configured to perform nested scalar quantization on the transformed data to generate a block of coset indices;
   a first encoding unit configured to encode bit planes of the block of coset indices using corresponding irregular repeat accumulate (IRA) encoders to index bins using parity check bits and generate corresponding parity bit streams, including parity bin indexes, wherein each of the IRA encoders is determined using a corresponding rate limit, wherein the corresponding rate limit is computed for the corresponding bit plane; and
   a transmitter configured to transmit the parity bit streams over a channel.

7. The system of claim 6 further comprising:
   a second encoding unit configured to encode a version of the video data, wherein said version has a lower image quality than the video data;
   wherein the transmitter is also configured to transmit the encoded version of the video data to the destination device over the channel.

8. The method of claim 1, wherein the rate limit for a given one of the bit planes is equal to a conditional entropy associated with the bit plane divided by a capacity of the channel, wherein a coderate of each of the IRA encoders is less than or equal to a respective one of the rate limits.

9. The system of claim 6, wherein each of the IRA encoders is optimized to perform both source coding and error protection coding on the corresponding bit plane.

10. A system comprising:
    a memory configured to store program instructions; and
    a processor configured to access the program instructions from the memory and execute the accessed program instructions to perform operations comprising:
      perform energy-concentrating transform operations on a group of frames of video data to obtain transformed data;
      perform nested scalar quantization on the transformed data to generate a block of coset indices;
      compute rate limits for bit planes of the block of coset indices;
      determine irregular repeat accumulate (IRA) encoders, configured to index bins using parity check bits, for the bit planes using the rate limits;
      encode the bit planes using the IRA encoders to generate corresponding parity bit streams, including parity bin indexes; and
      transmit the parity bit streams including the parity bin indexes, to a destination device over a channel.

11. The system of claim 10, wherein the program instructions if executed by the computing device, cause the processor to perform operations comprising:
    encode a version of the video data, wherein said version has a lower image quality than the video data; and
    transmit the encoded version of the video data to the destination device over the channel.

12. The system of claim 10, wherein each of the IRA encoders is optimized to perform both source coding and error protection coding on a corresponding one of the bit planes.

13. A non-transitory computer-readable memory medium having instructions stored thereon that, if executed by a computing device, cause the computing device to perform operations comprising:
    perform energy-concentrating transform operations on a group of frames of video data to obtain transformed data;
    perform nested scalar quantization on the transformed data to generate a block of coset indices;
    compute rate limits for bit planes of the block of coset indices;
    determine irregular repeat accumulate (IRA) encoders, configured to index bins using parity check bits, for the bit planes using the rate limits;
    encode the bit planes using the IRA encoders to generate corresponding parity bit streams, including parity bin indexes; and
    transmit the parity bit streams, including the parity bin indexes, to a destination device over a channel.

14. The memory medium of claim 13, wherein the program instructions if executed by the computing device, cause the computing device to perform operations comprising:
    encode a version of the video data, wherein said version has a lower image quality than the video data; and transmit the encoded version of the video data to the destination device over the channel.

15. The memory medium of claim 13, wherein each of the IRA encoders is optimized to perform both source coding and error protection coding on a corresponding one of the bit planes.

16. A system comprising:
a decoder unit configured to receive input data from a channel, wherein the input data corresponds to parity bit streams generated by an encoder configured to:
    (a) perform energy-concentrating transform operations on a group of frames of video data to obtain transformed data;
    (b) perform nested scalar quantization on the transformed data to generate a block of coset indices;
    (c) compute rate limits for bit planes of the block of coset indices;
    (d) determine irregular repeat accumulate (IRA) encoders, configured to index bins using parity check bits, for the bit planes using the rate limits; and
    (e) encode the bit planes using the IRA encoders to generate said parity bit streams, including parity bin indexes, wherein the decoder unit is configured to decode the input data, using side information, to obtain an estimate for the block of coset indices; and
an estimation unit configured to generate an estimate for the group of frames of video data using the estimate for the block of coset indices and the side information.

17. The system of claim 16 further comprising a base layer decoder configured to:
receive base layer data corresponding to an encoded representation of a version of the video data wherein the version has lower image quality than the video data; and
decode the base layer data to obtain the side information.

18. The system of claim 16, wherein each of the IRA encoders is optimized to perform both source coding and error protection coding on a corresponding one of the bit planes.

19. A system comprising:
a memory configured to store program instructions; and
a processor configured to access the program instructions from the memory and execute the accessed program instructions to perform operations comprising:
receive input data from a channel, wherein the input data corresponds to parity bit streams generated by an encoder configured to:
    (a) perform energy-concentrating transform operations on a group of frames of video data to obtain transformed data;
    (b) perform nested scalar quantization on the transformed data to generate a block of coset indices;
    (c) compute rate limits for bit planes of the block of coset indices;
    (d) determine irregular repeat accumulate (IRA) encoders configured to index bins using parity check bits for the bit planes using the rate limits; and
    (e) encode the bit planes using the IRA encoders to generate said parity bit streams, including parity bin indexes;
decode the input data, using side information, to obtain an estimate for the block of coset indices; and
generate an estimate for the group of frames of video data using the estimate for the block of coset indices and the side information.

20. The system of claim 19, wherein the program instructions if executed by the computing device, cause the processor to perform operations comprising:
receive base layer data corresponding to an encoded representation of a version of the video data, wherein the version has lower image quality than the video data; and
decode the base layer data to obtain the side information.

21. The system of claim 19, wherein each of the IRA encoders is optimized to perform both source coding and error protection coding on a corresponding one of the bit planes.

22. A non-transitory computer-readable memory medium having instructions stored thereon that, if executed by a computing device, cause the computing device to perform operations comprising:
receive input data from a channel, wherein the input data corresponds to parity bit streams generated by an encoder configured to:
    (a) perform energy-concentrating transform operations on a group of frames of video data to obtain transformed data;
    (b) perform nested scalar quantization on the transformed data to generate a block of coset indices;
    (c) compute rate limits for bit planes of the block of coset indices;
    (d) determine irregular repeat accumulate (IRA) encoders configured to index bins using parity check bits for the bit planes using the rate limits; and
    (e) encode the bit planes using the IRA encoders to generate said parity bit streams, including parity bin indexes;
decode the input data, using side information, to obtain an estimate for the block of coset indices; and
generate an estimate for the group of frames of video data using the estimate for the block of coset indices and the side information.

23. The memory medium of claim 22, wherein the program instructions if executed by the computing device, cause the computing device to perform operations comprising:
receive base layer data corresponding to an encoded representation of a version of the video data, wherein the version has lower image quality than the video data; and
decode the base layer data to obtain the side information.

24. The memory medium of claim 22, wherein each of the IRA encoders is optimized to perform both source coding and error protection coding on a corresponding one of the bit planes.

25. A method comprising:
receiving input data from a channel, wherein the input data corresponds to parity bit streams generated by an encoder configured to:
    (a) perform energy-concentrating transform operations on a group of frames of video data to obtain transformed data;
    (b) perform nested scalar quantization on the transformed data to generate a block of coset indices;
    (c) compute rate limits for bit planes of the block of coset indices;
    (d) determine irregular repeat accumulate (IRA) encoders configured to index bins using parity check bits, for the bit planes using the rate limits; and
    (e) encode the bit planes using the IRA encoders to generate said parity bit streams including the parity bin indexes;
decoding the input data, using side information, to obtain an estimate for the block of coset indices; and generating an estimate for the group of frames of video data using the estimate for the block of coset indices and the side information.

26. The method of claim 25 further comprising:

receiving base layer data corresponding to an encoded representation of a version of the video data, wherein the version has lower image quality than the video data; and decoding the base layer data to obtain the side information.

27. The method of claim 25, wherein each of the IRA encoders is optimized to perform both source coding and error protection coding on a corresponding one of the bit planes.

* * * * *

UNITED STATES PATENT AND TRADEMARK OFFICE
CERTIFICATE OF CORRECTION

| | |
|---|---|
| PATENT NO. | : 8,073,052 B1 |
| APPLICATION NO. | : 11/494678 |
| DATED | : December 6, 2011 |
| INVENTOR(S) | : Xu et al. |

It is certified that error appears in the above-identified patent and that said Letters Patent is hereby corrected as shown below:

On the Face Page, in Field (56), under "OTHER PUBLICATIONS", in Column 2, Line 10, delete "problem,"IEEE" and insert -- problem," IEEE --, therefor.

On the Face Page, in Field (56), under "Primary Examiner", in Column 2, Line 1, delete "Jay Patel" and insert -- Jayanti K. Patel --, therefor.

On Page 2, in Field (56), under "OTHER PUBLICATIONS", in Column 1, Line 26, delete "Loµeve" and insert -- Loeve --, therefor.

In Column 3, Line 43, delete "$N_g$" and insert -- $N_B$ --, therefor.

In Column 3, Lines 44-47, delete "More generally, NSQ.........may be used." and insert the same as a new paragraph at Line 45.

In Column 5, Line 60, delete "(LLR)" and insert -- (LLRs) --, therefor.

In Column 10, Line 18, delete "Parity-based" and insert -- parity-based --, therefor.

In Column 15, Line 32, delete "$x^+$" and insert -- $x^\alpha$ --, therefor.

In Column 16, Line 21, delete "+0.148133x'+" and insert -- $+0.148133x^{12}+$ --, therefor.

In Column 18, Line 41, delete "Formey" and insert -- Forney --, therefor.

In Column 18, Line 49, delete "623-656 1948." and insert -- 623-656, 1948. --, therefor.

In Column 19, Line 14, delete "Interanational" and insert -- International --, therefor.

In Column 21, Line 34, in Claim 17, delete "data wherein" and insert -- data, wherein --, therefor.

Signed and Sealed this
Twenty-eighth Day of August, 2012

David J. Kappos
*Director of the United States Patent and Trademark Office*